United States Patent [19]

Sugiyama et al.

[11] Patent Number: 4,715,108
[45] Date of Patent: Dec. 29, 1987

[54] MACHINE TOOL CAPABLE OF CHANGING WORN CUTTING TOOLS, SUCH AS SMALL DIAMETER DRILLS, WITH NEW ONES

[75] Inventors: Kiyoshi Sugiyama, Susono; Kotaro Nakamura, Nagaizumi, both of Japan

[73] Assignee: Toshiba Kikai Kabushiki Kaisha, Tokyo, Japan

[21] Appl. No.: 836,417

[22] Filed: Mar. 5, 1986

[30] Foreign Application Priority Data

Mar. 7, 1985 [JP] Japan ................................ 60-45659
Feb. 6, 1986 [JP] Japan ................................ 61-24767

[51] Int. Cl.$^4$ ............................................ B23Q 3/157
[52] U.S. Cl. ...................................... 29/568; 29/26 A
[58] Field of Search .................... 29/568, 26 R, 26 A; 279/1 E; 408/3

[56] References Cited

U.S. PATENT DOCUMENTS

| | | | |
|---|---|---|---|
| 4,520,551 | 6/1985 | Imhof .................................. | 29/568 |
| 4,545,107 | 10/1985 | Bellmann et al. ..................... | 29/568 |
| 4,596,067 | 6/1986 | Raiteri ................................. | 29/568 |
| 4,654,953 | 4/1987 | Hobbs .................................. | 29/568 |

Primary Examiner—Z. R. Bilinsky
Attorney, Agent, or Firm—Stevens, Davis, Miller & Mosher

[57] ABSTRACT

A machine tool is disclosed as exemplified by a drilling machine for creating holes in printed circuit board blanks, comprising one or more toolheads each releasably holding a drill for working on the blanks on a table, the latter being movable horizontally to and away from a preassigned tool change position. The table has mounted thereon a row of old tool pots each for temporarily holding a worn drill released from one of the toolheads, prior to discharge to a recovery mechanism under the table, and a row of new tool pots each for temporarily holding a new drill to be held by one of the toolheads in substitution for the old drill released therefrom in the associated old tool pot. When the table is in the tool change position, with the worn drills held in the old tool pots, a tool pusher mechanism operates for concurrently pushing the worn drill in each old tool pot down through the table toward the recovery mechanism, and one of new drills in a new tool cartridge down through its tool outlet into each new tool pot.

19 Claims, 14 Drawing Figures

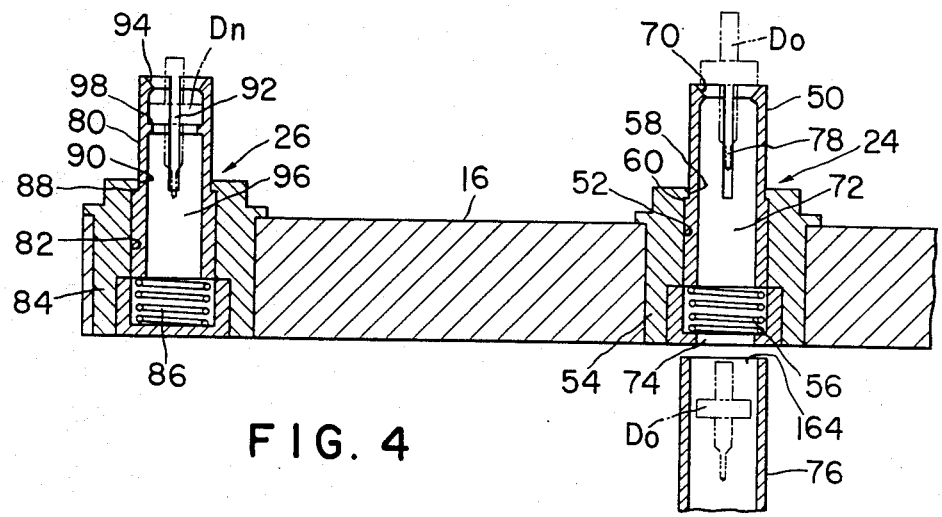
FIG. 4
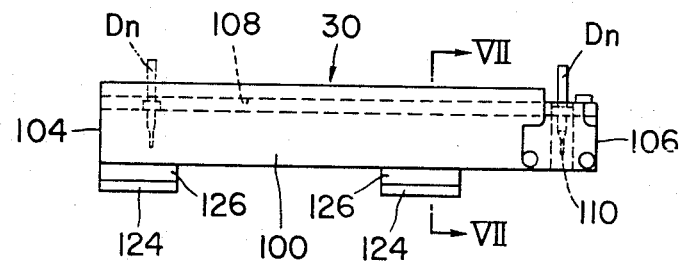
FIG. 5
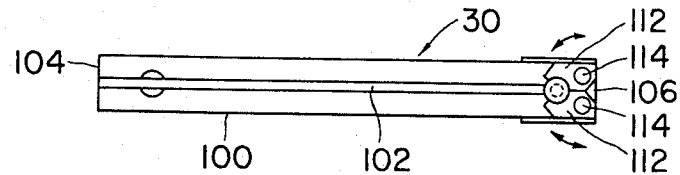
FIG. 6
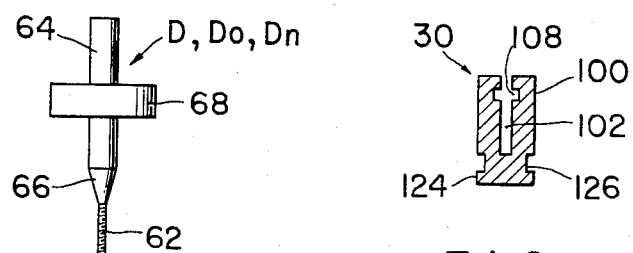
FIG. 8
FIG. 7

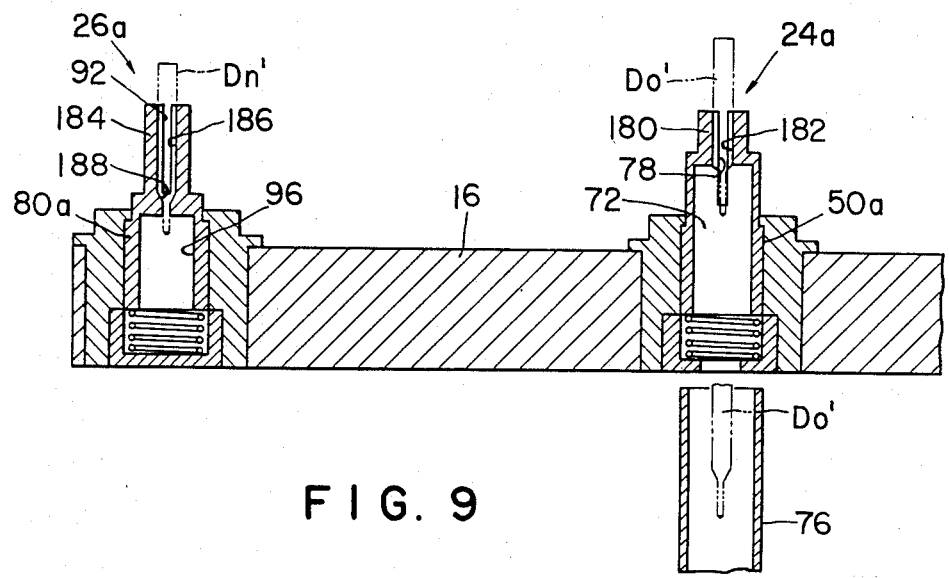
FIG. 9
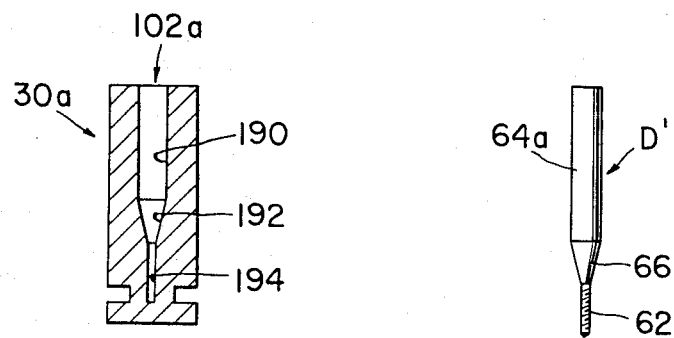
FIG. 10
FIG. 11
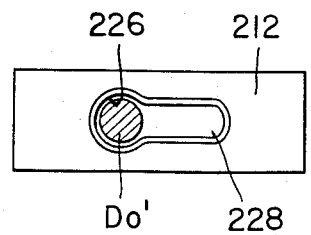
FIG. 14

MACHINE TOOL CAPABLE OF CHANGING WORN CUTTING TOOLS, SUCH AS SMALL DIAMETER DRILLS, WITH NEW ONES

BACKGROUND OF THE INVENTION

Our invention relates generally to machine tools and more specifically to those equipped for the replacement of the cutting tools, when they are worn from use, with new ones. Still more specifically, our invention concerns a power driven machine for drilling small diameter holes in work such as, typically, printed circuit board (PCB) blanks (or insulating bases for PCBs), with particular emphasis on its facilities for the quick change of the worn drills.

PCB blank drilling machines have found widespread acceptance in the electronics industry for the mass production of PCBs of various circuit configurations. Generally, such machines comprise a plurality of drills releasably mounted to respected spindleheads above a table on which the work is to be mounted. The drills for use with PCB blanks are unique in the small diameters of their cutting bodies, being usually from about 0.1 to 1.5 millimeters. Such small diameter drills are of course susceptible to ready wear, especially at their lips or cutting edges. A quick replacement of the worn drills is one of the prerequisites for the higher production of the machine.

We are aware of several prior art drilling machines equipped for drill change. According to one such known machine, which we believe is most pertinent to our invention, a row of new drills are mounted upstandingly along one edge of the table. These new drills are engaged and held by the overhead spindles for use. When worn, the old drills are released from the spindles and deposited upstandingly on the table. Then another set of new drills which have been kept standing by on the table are caught by the spindles.

One of the problems with this known drill change system is that separate fluid actuated cylinders or like actuators are employed for the loading of successive new sets of drills on the table and for the withdrawal of the old sets of drills therefrom. The drill changers with the many actuators as well as means associated with each actuator have been bulky in size and complex in construction, adding substantially to the space requirements and manufacturing costs of the drilling machines themselves.

We also object to the prior art drilling machines with the tool changing capability in connection with the recovery of the worn drills. The common practice with PCB blank drilling machines is to regrind the used drills for reuse. Therefore, when the machine employs different diameter drills, they should be recovered separately, and in as neatly arranged form as possible, to expedite the subsequent process of redressing. Care must also be taken so that the drills may not be chipped or otherwise impaired through forced contact with one another or with other parts during recovery.

SUMMARY OF THE INVENTION

We have hereby found out how to simplify the provisions for changing cutting tools in a machine tool of the type under consideration and hence to make the complete apparatus more compact in size and less expensive in construction. We have also succeeded in efficiently recovering the worn cutting tools, either in bulk form or in neatly arranged form, without the likelihood of damaging them in so doing.

Stated broadly, our invention provides a machine tool capable of changing old cutting tools, worn from use, with new ones, comprising a table mounted to frame means for reciprocating movement in a predetermined horizontal direction to and away from a preassigned tool change position, and at least one toolhead disposed over the table and releasably holding a cutting tool. The table has formed thereon an old tool pot for temporarily holding in an upstanding attitude an old tool released from the toolhead, the old tool pot defining a discharge passageway for the discharge of the old tool, and a new tool pot for temporarily holding in an upstanding attitude a new tool to be held by the toolhead in substitution for the old tool released therefrom in the old tool pot. For the supply of new tools to the new tool pot, an elongate new tool cartridge is provided which slidably holds a row of upstanding new tools and which has a tool outlet adjacent one end thereof. The new tool cartridge is so disposed that the tool outlet thereof overlies and is aligned with the new tool pot on the table when the table is in the tool change position. Also included are tool pusher means having but one actuator for concurrently pushing, when the table is in the tool change position, the old tool in the old tool pot down into the discharge passageway and one of the new tools in the new tool cartridge down through the tool outlet thereof into the new tool pot.

Thus, according to our invention, the transfer of a new tool from the cartridge to the new tool pot and the discharge of the old tool through the old tool pot are accomplished simultaneously by the pusher means driven by the single actuator. Consequently, not only is the tool changing mechanism materially simplified in construction, but also appreciably curtailed is the lenth of time required the length of time required for each tool change operation.

Any desired number of new tool cartridges, each containing a row of new tools, may be prepared for successive delivery of the new tools to the new tool pot. Since the tool changing mechanism of our invention is well calculated for automatic operation, the machine tool itself incorporating the mechanism may be operated automatically for an extended length of time.

Our invention also features old tool recovery means associated with the old tool pot for recovering the successive old tools discharged therethrough. In one embodiment the old tool recovery means comprises a recovery box for receiving the discharged old tools through a chute. When filled up, the recovery box may be carried away for the redressing of the worn tools. We recommend in this embodiment the provision of a rectractable gate at the exit end of the chute for temporarily arresting each old tool. The gate may be retracted each time one old tool is arrested, in order that the tool may land gently onto the heap of previously recovered tools in the recovery box without damaging one another.

In another embodiment we have refined the old tool recovery means so that the discharged old tools are lined up in successive cartridges. Each old tool cartridge can be of the same construction as the noted new tool cartridge from which new tools are supplied to the new tool pot. Therefore, recovered in cartridge form, the old tools lend themselves to immediate use as new tools for less precise cutting jobs. Another advantage gained by this refined recovery means is that the successively discharged old tools do not contact one another throughout the complete process of recovery. There is, accordingly, absolutely no possibility of tool impairment through mutual contact.

We have disclosed our invention in the following embodiments thereof as adapted for a PCB blank drilling machine, having a plurality of toolheads for carrying drills of like or unlike diameters. In such a machine the table may have formed thereon as many old tool pots, and as many new tool pots, as the toolheads. A tool pusher mechanism having but one actuator is provided for each associated pair of old and new tool pots. New drills are supplied successively to each new tool pot from a group of new tool cartridges. The different groups of new tool cartridges may contain drills of different diameters in cases where such different diameter drills are required for the respective toolheads.

Each old tool pot, on the other hand, can be provided with its own tool recovery means, which can be of either of the two different configurations set forth previously. This arrangement makes it possible to recover the different diameter drills in the different recovery boxes or in the different old tool cartridges for the ease of subsequent handling.

The above and other features and advantages of our invention and the manner of realizing them will become more apparent, and the invention itself will best be understood, from a study of the following description and the appended claims, with reference had to the attached drawings showing the preferred embodiments of our invention.

BRIEF DESCRIPTION OF THE DRAWINGS

FIG. 4 is an enlarged, fragmentary vertical section through the tool change mechanism of FIG. 3, showing in particular one of the old tool pots and one of the new tool pots;

FIG. 5 is a side elevation of one of the new tool cartridges used in the tool change mechanism of FIG. 3;

FIG. 6 is a top plan of the new tool cartridge of FIG. 5;

FIG. 7 is a cross section through the new tool cartridge, taken along the line VII—VII in FIG. 5;

FIG. 8 is an elevation of each drill used with the drilling machine of FIGS. 1 and 2;

FIG. 9 is a view similar to FIG. 4 but showing alternative forms of the old and new tool pots;

FIG. 10 is a view similar to FIG. 7 but showing an alternative form of the new tool cartridge;

FIG. 11 is an elevation of an alternative drill for use with the tool pots of FIG. 9 and with the cartridge of FIG. 10;

FIG. 14 is an enlarged top plan of the gate in the alternative old tool recovery mechanism of FIGS. 12 and 13, seen in the direction of the arrows XIV in FIG. 13.

DESCRIPTION OF THE PREFERRED EMBODIMENTS

General

Figure 1:
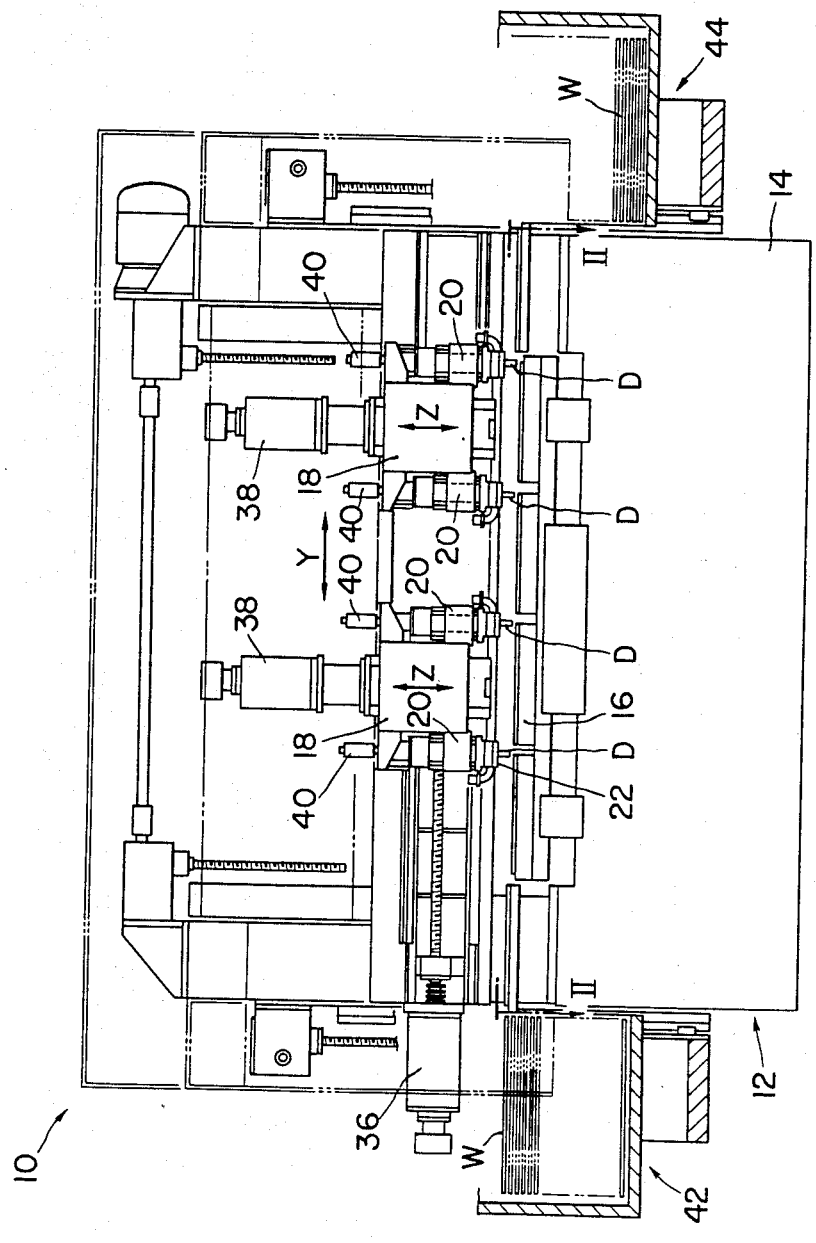
FIG. 1 is a front elevation of the PCB blank drilling machine constructed in accordance with the novel concepts of our invention.
Figure 2:
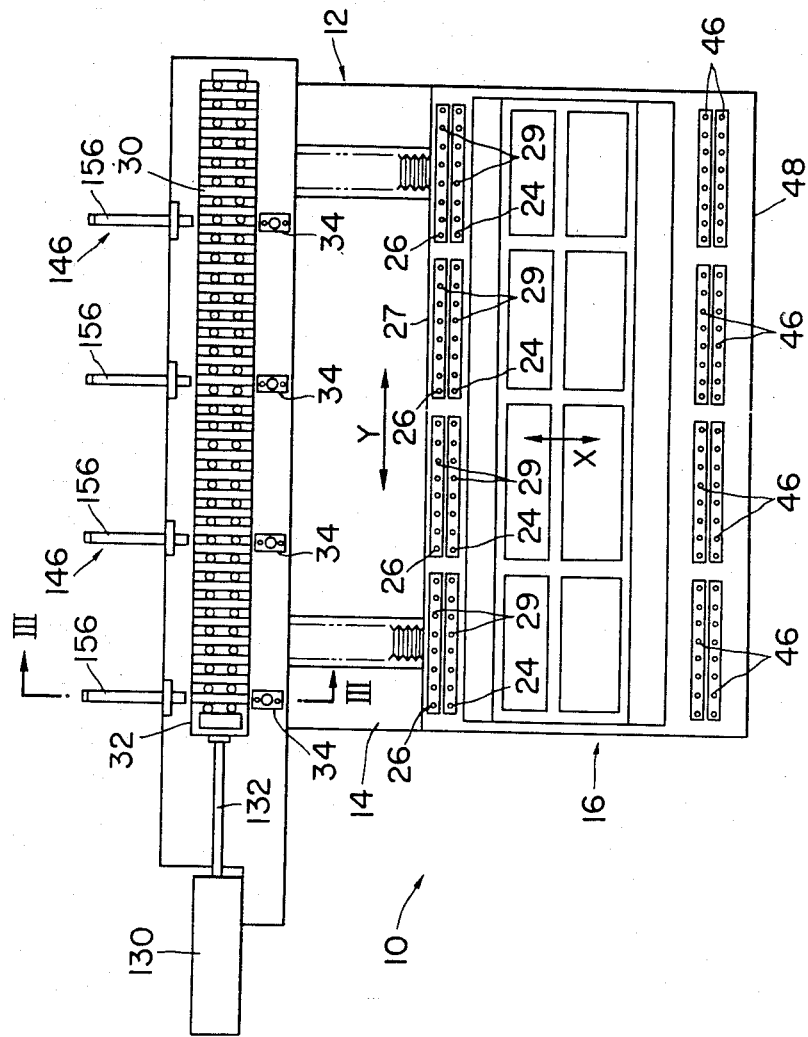
FIG. 2 is a horizontal section through the drilling machine of FIG. 1, taken along the line II—II therein.

We will now describe in detail the machine tool of our invention as typified by the multiple spindle drilling machine, shown in FIGS. 1 and 2 and therein generally designated 10, for the creation of holes in PCB blanks. The drillig machine 10 has a framework 12 including a bed 14. Mounted on the bed 14 is a table 16 on which the work is to be drilled and which is reciprocably movable with respect to the bed in a first horizontal direction indicated by the double headed arrow X in FIG. 2.

Disposed over the table 16 are a pair of saddles 18 rigidly interconnected for joint reciprocation in a second horizontal direction, indicated by the double headed arrow Y in FIGS. 1 and 2, at right angles with the first horizontal direction X. Each saddle 18 has mounted thereto a pair of upstanding toolheads or spindleheads 20 which are reciprocably movable vertically, as indicated by the double headed arrows Z in FIG. 1, toward and away from the table 16. Each toolhead 20 has a drill D of relatively small diameter releasably affixed to its pindle 22 and depending therefrom. The total of four toolheads 20, and therefore of four drills D, employed in this embodiment are aligned in the second horizontal direction Y, with predetermined spacings therebetween. The drills D carried by the four toolheads 20 can be of either like or unlike diameter, depending, of course, upon the diameter or diameters of the holes to be drilled.

FIG. 2 shows that the table 16 has a row of four old tool pots 24 and a row of four new tool pots 26 along its rear edge 27. As will be seen from FIGS. 3 and 4, old tool pot 24 is intended for temporarily holding in an upstanding attitude therein an old or worn drill Do that has been released by one of the toolheads 20, prior to discharge to one of four old tool recovery mechanisms 28. Each new tool pot 26 is intended for temporarily holding in an upstanding attitude a new drill Dn, which is to be subsequently engaged and carried away from the new tool pots by the toolheads 22. The four old tool pots 24, and the four new tool pots 26, are both aligned in the second horizontal direction Y, with each old tool pot spaced a small distance forwardly (toward the viewer as seen in FIG. 1 and downwardly as seen in FIG. 2) from one of the new tool pots 26.

We have provided additional tool pots 29, FIG. 2, along the rear edge 27 of the table 16 in FIG. 2. These are auxiliary pots for upstandingly holding special purpose drills to be used less frequently than those to be held by the new tool pots 26. These auxiliary new tool pots constitute no essential feature of our invention.

Figure 3:
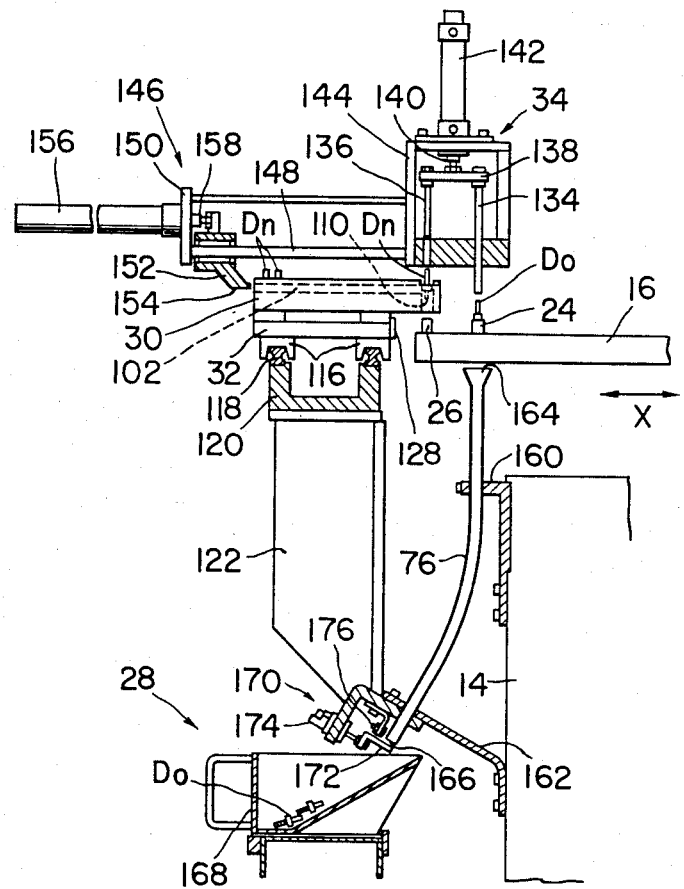
FIG. 3 is an enlarged vertical section through the tool change mechanism incorporated with the drilling machine of FIGS. 1 and 2, the section being taken along the line III—III in FIG. 2.

For the successive delivery of the new drills Dn to the new drill pots 26, we have employed a plurality or multiplicity of new tool cartridges 30 shown in both FIGS. 2 and 3 and in greater detail in FIGS. 5 through 7. Each cartridge holds a row of new drills Dn for sliding movement in its longitudinal direction. All the new tool cartridges 30 are removable mounted on an elongate cartridge carriage 32 extending in the second horizontal direction Y, with each cartridge oriented transversely, or in the first horizontal direction X, on the cartridge carriage. The cartridge carriage 32 makes it possible to bring the successive new tool cartridges 30 into alignment with the new tool pots 26 on the table 16 for the transfer of the new drills Dn from the former to the latter.

We must point out in conjunction with FIG. 3 that the table 16 is therein shown moved to its extreme rearward position. The new drills Dn are to be transferred from from new tool cartridges 30 to new tool pots 26, and the old drills Do to be discharged from old tool pots 24 to old tool recovery mechanisms 28, when the table 16 is in the extreme rearward position on the bed 14. We will therefore refer to this table positon as the tool change position.

As will be seen from FIG. 2, four tool pusher mechanisms 34 are disposed just forwardly of the cartridge carriage 32 and in alignment, in the first horizontal direction X, with the four old tool pots 24 and with the four new tool pots 26. When the table 16 is in the tool change position as in FIG. 3, the tool pots 24 and 26 come under the tool pusher mechanisms 34. Each tool pusher mechanism 34 functions to push the old drill Do in the associated old tool pot 24 down through the table 16 toward the associated old tool recovery mechanism 28 and, simultaneously, to push the new drill Dn in the associated new tool cartridge 30 down into the associated new tool pot 26.

We will discuss in further detail hereinbelow the general construction of the drilling machine 10, the new tool pots 24, the old tool pots 26, the new tool cartridges 30, the tool pusher mechanisms 34, and the old tool recovery mechanisms 28, in that order, under the respective headings. The operational description of the drilling machine 10, particularly in regard to its tool changing operation, will follow the detailed discussion of the listed components.

Drilling Machine Construction

Seen at 36 in FIG. 1 is a saddle drive motor, preferably a servomotor, for reciprocably moving the pair of interconnected saddles 18 in the second horizontal direction Y. Each saddle 18 has a toolhead drive motor 38, also preferably a servomotor, mounted upstandingly thereon for moving the associated pair of toolheads 20 up and down, or toward and away from the table 16. Each toolhead 20 is further provided with a spindle drive motor 40 for imparting rotation to the spindle 22 and hence to the drill D affixed thereto.

As shown also in FIG. 1, the drilling machine 10 is further provided with a work loading station 42 and a work unloading station 44 on both sides of the bed 14. A multiplicity of PCB blanks W to be drilled are held in a stack at the loading station 42. The PCB blanks W are to be successively transferred from the loading station 42 onto the table 16 and, upon completion of the drilling, to be unloaded therefrom to the unloading station 44.

We understand that the drilling machine 10 is equipped with a work transfer mechanism for the automatic transfer of the successive PCB blanks W from the loading station 42 to the table 16 and thence to the unloading station 44. We have not shown the work transfer mechanism in order to better illustrate the other parts of the machine that are more pertinent to or present invention. The work transfer mechanism well suited for use with this drilling machine 10 is described and claimed in our separate application filed substantially concurrently herewith under the title, "Machine Tool for Drilling or Otherwise Working on Printed Circuit Boards or Like Flat Work".

With reference to FIG. 2 the table 16 has some additional groups of auxiliary new tool pots 46 disposed along its front edge 48. Like the aforesaid auxiliary new tool pots 29, these pots 46 are intended for holding drills to be used less frequently than those in the new tool cartridges 30. Such special purpose drills may be manually inserted in the auxiliary new tool pots 29 and 46.

Old Drill Pots

The four old tool pots 24 employed in this embodiment can all be of like design, so that we will describe only one of them with reference to FIG. 4, it being understood that the same description applies to each of the other old tool pots.

The representative old tool pot 24 includes a pot body 50 in the form of a hollow, upstanding cylinder partly received with a sliding fit in a hole 52 defined by a pot holder 54 embedded in the table 16. Seated against a helical compression spring 56, the pot body 50 is thereby biased upwardly of the table 16. The upward displacement of the pot body 50 is limited as the inside rim 58 on the top end of the pot holder 54 engages an annular shoulder 60 formed on the pot body.

Before proceeding further with the description of the old tool pot 24, we will briefly explain the configuration of the drills D, both old and new, for use with the drilling machine 10. As illustrated in FIG. 8, each drill D has a drill body 62 connected to a shank 64 via a tapered shoulder 66. The shank 64 has a flange 68 formed thereon at approximately midway between its opposite ends.

With reference back to FIG. 4, the pot body 50 of the old tool pot 24 has an inside rim 70 formed on its top end. Released from one of the toolheads 20, the old drill Do is to be held in the old tool pot 24 with flange 68 resting on the inside rim 70 of the pot body 50 and with its shank 64 partly protruding upwardly therefrom. The old drill Do is to be subsequently pushed by one of the tool pusher mechanism 34, FIG. 3, down into a discharge passageway 72 defined by the pot body 50 and thence, through a hole 74 in the table 16, into a tubular chute 76 leading to, or forming a part of, one of the old tool recovery mechanisms 28 shown in FIG. 3.

In order to allow the old drill Do to be pushed as above into the discharge passageway 72 of the pot body 50 in the face of its inside rim 70, the pot body has a plurality of, four for example, slits 78 extending downwardly from its top end at constant circumferential spacings. When the old drill Do is pushed, the slits 78 will cause the constituent segments of the top end portion of the pot body 50 to spread apart by elastic deformation to an extent necessary for allowing the flange 68 of the old drill to ride over the inside rim 70.

New Tool Pots

The four new tool pots 26 seen in FIG. 2 can also be of identical make, so that we will describe only the one illustrated in detail in FIG. 4. The new tool pot 26 has a pot body 80 in the form of a hollow, upstanding cylinder partly received with a sliding fit in a hole 82 defined by a pot holder 84 buried fast in the table 16. A helical compression spring 86 urges the pot body 80 upwardly of the table 16. The upward displacement of the pot body 80 is limited as an annular shoulder 88 on the pot body butts on the inside rim 90 of the pot holder 84.

The new tool pot body 80 also has a plurality of, four for example, slits 92 extending downwardly from its top end. The thus slitted top end portion of the pot body 80 is elastically deformable to allow the new tool Dn to be pushed past its inside rim 94 into its hollow 96. An annular ledge 98 is formed internally of the pot body 80 some distance below its top end. Pushed into the pot body hollow 96, the new drill Dn is to have its flange 68 arrested by the ledge 98 and so is to be held upstandingly with its shank 64 partly protruding upwardly from the pot body 80.

Drill Cartridges

We have illustrated in detail the construction of each drill cartridge 30. It includes an elongate, generally boxlike body 100 having a relatively deep, upwardly open groove or tool guideway 102 extending longitudinally between its rear end 104 and front 106. The tool guideway 102 is for slidably receiving a multiplicity of new drills Dn in a row, each in an upstanding attitude, with the shank 64 of each drill partly protruding upwardly therefrom. The tool guideway 102 has a pair of lateral expansions 108 for accommodating the flanges 68 of the new drills Dn.

Adjacent the front end 106 of the cartridge body 100 there is formed a vertical tool outlet 110, open both upwardly and downwardly, in direct communication with the tool guideway 102 for the discharge of the successive new drills Dn down into the associated new tool pot 26. The foremost one of the new drills Dn are releasably held at the tool outlet 110 between a pair of gripping jaws 112 which are pivoted to respective pins 114 and spring toward each other.

With reference to FIGS. 2 and 3 a multiplicity of the new tool cartridges 30, each constructed as in the foregoing, are removably mounted side by side on the noted cartridge carriage 32 disposed behind the bed 16 and extending in the second horizontal direction Y. The cartridge carriage 32 has shoes 116 slidably riding on a pair of guide rails 118. These guide rails are mounted on a channel sectioned beam 120 which in turn is mounted on fixed support means 122 constituting part of the framework 12, FIG. 1, of the drilling machine 10.

We assume that the cartridge carriage 32 has defined therein a multiplicity of undercut guide grooves, not shown, extending transversely thereof. As will be seen by referring again to FIGS. 5 and 7, each new tool cartridge 30 has a pair of shoes 124 formed in one piece therewith in longitudinal alignment with each other. Each shoe 124 has a pair of recesses 126 on its opposite sides. These shoes 124 of each cartridge 30 are slid into one of the undercut guide grooves in the cartridge carriage 32 from its rear edge, into abutment against a stop 128 formed on and along its front edge.

Thus mounted in place on the cartridge carriage 32, the new tool cartridge 30 can be moved by the carriage to one of the four prescribed positions where the tool outlet 110 of each cartridge is in vertical register with one of the four new tool pots 26 on the table 16 when this table is in the tool change position.

At 130 in FIG. 2 is shown a fluid actuated cylinder, either pneumatic or hydraulic, having a piston rod 132 coupled to the cartridge carriage 32. According to the arrangement of FIG. 2 the new tool cartridges 30 on the cartridge carriage can be successively brought to the positions of alignment with the four new tool pots 26 on the table 16 with the stepwise contraction of the fluid actuated cylinder 130. We will refer to this cylinder as the cartridge carriage cylinder in contradistinction from other cylinders to be set forth hereafter.

Tool Pusher Mechanisms

As illustrated in detail in FIG. 3, each tool pusher mechanism 34 comprises an old tool pusher rod 134 and a new tool pusher rod 136, both extending vertically downwardly from a yoke 138. When the table 16 is in the tool change position as in FIG. 3, the old tool pusher rod 134 is in alignment with one of the old tool pots 24 on the table, the new tool pusher rod 136 with one of the new tool pots 26 thereon. Further one of the new tool cartridges 30 on the cartridge carriage 32 intervenes between new tool pusher rod 136 and new tool pot 26, with its tool outlet 110 in alignment with both. The new tool pusher rod 136 is therefore made considerably shorter than the old tool pusher rod 134.

The yoke 138 is coupled to the piston rod 140 of a fluid actuated cylinder 142, preferably pneumatic, mounted upstandingly on frame means 144. Both pusher rods 134 and 136 are therefore thrusted downwardly upon extension of this cylinder 142. Thereupon the old tool pusher rod 134 will force the old drill Do in the associated old tool pot 24 down into the discharge passageway 72, FIG. 4, and thence into the associated chute 76 leading to one of the old tool recovery mechanisms 28. The new tool pusher rod 136, on the other hand, will push the foremost one of the new drills Dn in the associated new tool cartridge 30 down through its tool outlet 110 into the associated new tool pot 26. The fluid actuated cylinder 142 may therefore be termed the pusher cylinder.

Functionally associated with the tool pusher mechanisms 34 are new tool feed mechanisms 146 shown also in FIG. 3. The row of new drills Dn in each cartridge 30 must be fed forwardly along its guideway 102 each time the foremost drill is thrusted down through its tool outlet 110 by the new tool pusher rod 136 as above. We have provided the new tool feed mechanisms 146 to this end.

Each new tool feed mechanisms 146 includes a guide bar or bars 148 extending horizontally rearwardly from the frame means 144 of one of the tool pusher mechanisms 34 and coupled to a cylinder mount 150. A slider 152 is slidably mounted on the guide bars 148. Depending from the slider 152, a feed finger 154 is movable into and out of sliding engagement in the linear guideway 102 in that one of the new tool cartridges 30 on the cartridge carriage 32 which is positioned in alignment with the tool pots 24 and 26 on the table 16. A fluid actuated cylinder 156, preferably pneumatic, on the cylinder mount 150 has its piston rod 158 coupled to the slider 152.

Therefore, with the extension of the cylinder 156, the feed finger 154 will feed the row of new drills Dn in the associated cartridge 30 toward its tool outlet 110. The cylinder 156 may be contracted for withdrawing the feed finger 154 from the cartridge 30 during the movement of the cartridge carriage 32. We will refer to this cylinder 156 as the feed cylinder.

Old Tool Recovery Mechanisms

FIG. 3 also shows in detail one of the four old tool recovery mechanisms 28 of like construction. Each old tool recovery mechanisms 28 includes the noted chute 76 which is supported by the bed 14 via an upper bracket 160 and a lower bracket 162. The chute 76 has an entrance end 164 and an exit end 166. The entrance end 164 is open to the discharge passageway 72 of one of the old tool pots 24 on the table 16 when this table is in the tool change position of FIG. 3. The exit end 166 of the chute 76, on the other hand, is open to a portable recovery box 168. Accordingly, thrusted into the discharge passageway 72 by the old tool pusher rod 134 of the tool pusher mechanism 34, the successive old drills Do will travel through the chute 76 into the recovery box 168 by gravity.

Should the old drills Do be allowed to plunge from the chute 76 directly onto an existing heap of drills in the recovery box 168, they would damage one another through the collision. This of course is undesirable as the worn drills are to be reground and put to reuse.

We have therefore provided a gate mechanism 170 for temporarily arresting each old drill Do at the exit end 166 of the chute 76. The gate mechanism 170 includes a gate 172 coupled to a suitable gate actuator 174, such as a fluid actuated cylinder, on the lower bracket 162. The gate 172 is movable back and forth for opening and closing the exit end 166 of the chute 76. Normally, the gate 172 closes the chute exit end 166 and opens the same after each old drill Do has been thereby arrested, allowing the drill to land softly on the existing heap of old drills in the recovery box 168. A tool sensor 176 is disposed adjacent the chute exit end 166 for sensing the arresting of each old drill Do by the gate 172 and, thereupon, for opening the gate.

Operation

The new tool cartridges 30, loaded with new drills Dn, may be mounted in place on the cartridge carriage 32. If the four toolheads 20 of this drilling machine 10 are to be fitted with drills of different diameters, the new drills Dn of four such different diameters may be loaded in as many groups of the new tool cartridges 30. These four groups of new tool cartridges 30 may be mounted in separate regions on the cartridge carriage 32 so that the new drills Dn of each particular diameter may be delivered via one of the new tool pots 26 to the required one of the four toolheads 20. The four toolheads 20 may be put to use with only two different diameters of drills. In that case the new tool cartridges 30 may be loaded with the two different diameters of new drills, and the two groups of new tool cartridges 30 may be mounted in prescribed separate regions on the cartridge carriage 32.

In short, in this particular embodiment, the new tool cartridges 30 may be loaded with drills Dn of either the same diameter or up to four different diameters and may be placed in desired relative arrangement on the cartridge carriage 32. The diameter or diameters of the new drills Dn and the placement of the loaded cartridges 30 on the carriage 32 are of course subject to change depending upon each particular job assigned to the drilling machine 10.

Upon commencement of drilling operation the unshown work transfer mechanism will operate to load on the table 16 each prescribed number of PCB blanks W from their stack at the loading station 32 onto the table 16. The drills D on the spindles 22 of the toolheads 20 will create holes of like or unlike diameters in the loaded PCB blanks W in preassigned positions thereon, with the displacement of the table 16 in the first horizontal direction X, and of the saddles 18 in the second horizontal direction Y, with respect to the bed 14. The drilled PCB blanks W will be unloaded from the table 16 and stacked at the unloading station 44.

The drills D on the toolheads 20 must be replaced by new ones when worn. The time for changing the drills may be determined either on the basis of a prescribed period of drilling operation or of a preassigned number of holes drilled. We suggest the following procedure for such drill change.

With the drilling operation suspended, the table 16 may be moved forwardly (toward the viewer as seen in FIG. 1 and downwardly as seen in FIG. 2) to an extent necessary for locating the row of four old tool pots 24 in vertical register with the four old drills Do now being carried by the toolheads 20. The saddles 18 may also be moved in the second horizontal direction in order that the old drills Do on the toolheads 20 may come into vertical axial alignment with the respective old tool pots 24 on the table 16. Then the toolheads 20 may be lowered to insert the old drills Do in the respective old tool pots 24. Subsequently released from the toolheads 20, the old drills Do may be left upstandly on the old tool pots 24, with their flanges 68 resting on the inside rims 70 at the top ends of the old tool pots 24.

Then the table 16 may be moved rearwardly of the bed 12 to the tool change position of FIG. 3, together with the released old drills Do in the old tool pots 24. Now the old tool pusher rods 134 of the tool pusher mechanisms 34 are in vertical alignment with the old drills Do in the old tool pots 24, and their new tool pusher rods 136 in vertical alignment with the empty new tool pots 26 via the tool outlets 110 of four of the tool new cartridges 30 on the carriage 32.

We understand that by this time, the feed cylinders 156 of the new tool feed mechanisms 146 have been activated to feed the rows of new drills Dn in the four associated cartridges 30 toward their tool outlets 110 via the feed fingers 154 of the sliders 152. The foremost one of the new drills Dn in each of the four associated cartridges 30 has thus been caught between the pair of gripping jaws 112, FIG. 6, thereby to be releasably held at the tool outlet 110 under spring pressure, ready to be pushed down into the new tool pots 26.

Then the pusher cylinders 142 of the tool pusher mechanisms 34 may all be extended for lowering the pusher rods 134 and 136. The lowered old tool pusher rods 134 will thrust the old drills Do in the old tool pots 24 down into the discharge passageways 72, with the elastic expansion of the slitted top end portions of the old tool pot bodies 50 as the flanges 68 of the old drills ride over their inside rims 70. The old drills Do will fall under their own weight from the discharge passageways 72 into the chutes 76 through the holes 74 in the table 16.

Traveling down through the chutes 76, the old drills Do will be arrested at their exit ends 166 by the gates 172. Then the tool sensor 176 adjacent the exit end 166 of each chute 76 will sense the arrested old drill Do and will cause the gate actuator 174 to be activated for retracting the gate 172 away from the chute exit end 166. The old drills Do will thus be gently deposited into the recovery boxes 168 without damaging, or being damaged by, the old drills that have been previously recovered.

The lowered new tool pusher rods 136, on the other hand, will push the foremost new drills Dn in the four pertinent new drill cartridges 30 down through their tool outlets 110 into the respective new tool pots 26. The pair of gripping jaws 112 at the tool outlet 110 of each cartridge 30 will readily release the foremost new drill Dn against the spring pressure when the drill is pushed by one of the new drill pusher rods 136.

While being thrust as above into the new tool pots 26, the new drills Dn will elastically expand the slitted top end portions of the new tool pot bodies 80 as the drill flanges 68 ride over the inside rims 94 of the pot bodies. The new drills Dn will be inserted in the new tool pots 26 until their flanges 68 come to rest on the annular ledges 98.

Now that the old drills Do have been discharged from the old tool pots 24 and recovered in the recovery boxes 168, and the new drills Dn transferred from the cartridges 30 to the new tool pots 26, the table 16 may be moved away from the tool change position to the position where the loaded new tool pots 26 are in vertical alignment with the toolheads 20. Then the toolheads 20 may be lowered into enagement with the shanks 64 of the new drills Dn being held by the new tool pots 26. Then the toolheads 20 may be raised with the new drills Dn, thereby withdrawing them from the new tool pots 26.

We have thus completed one cycle of tool changing operation. The drilling machine 10 may now be reset into another run of drilling operation with the new set of drills Dn.

When the initial set of four new tool cartridges 30 are used up by the repitition of the foregoing cycles of tool changing operation, the cartridge carriage cylinder 130 may be actuated to bring the next four cartridges 30 into alignment with the respective tool pusher mechanisms 34 and new tool feed mechanisms 146. Then the worn drills may be changed with the new ones in these new cartridges through the same procedure as above. In cases where some special size drills are loaded in one or more of the cartridges 30 on the cartridge carriage 32, the cartridge or cartridges may be moved into alignment with the required tool pusher mechanism or mechanisms by the cartridge carriage cylinder 130.

When filled up with the old drills Do that have been discharged as above described, the recovery boxes 168 may be transported away to a location where the old drills are reground for reuse. The redressed drills may be loaded as new drills Dn into the cartridges 30. As will be understood, if the drilling machine 10 uses drills of four different diameters for the respective toolheads 20, these four kinds of drills will be recovered in the respective recovery boxes 168. The subsequent redressing of the different diameter drills will therefore be much easier than if they were recovered all in a bunch.

Alternative Tool Pots and Tool Cartridges

We have illustrated alternative constructions of old tool pot 24a and new tool pot 26a in FIG. 9, and of new tool cartridge 30a in FIG. 10. These alternative structures are intended for use with drills D' of correspondingly modified construction shown in FIG. 11.

With reference first to FIG. 11 each modified drill D' has a straight shank 64a, with no flange formed thereon. The straight shank 64a is connected to the drill body 62 via the tapered shoulder 66.

As show in FIG. 9, each alternative old tool pot 24a for holding the old drills Do' of the above modified construction has a pot body 50a in the form of a hollow, upstanding cylinder, with a constricted neck 180 extending upwardly therefrom in axial alignment with the pot body. The constricted neck 180 has a bore 182 extending axially therethrough into communication with the discharge passageway 72 and thence with the chute 76. One or more slits 78 are cut longitudinally in the constricted neck 180. The diameter of the axial bore 182 in the constricted neck 180 is such that, upon insertion of the old drill Do' therein, its straight shank 64a will snugly fit therein with some elastic deformation of the neck in its radially outward direction. The old drill Do' will thus be resiliently held upstandingly in the pot body neck 180, as indicated by the phantom outline in FIG. 9. Further, upon descent of the associated old tool pusher rod 134, FIG. 3, the old drill Do' will slide down the neck bore 182 in opposition to the radially inward pressure from the neck 180 and so will fall into the discharge passageway 72 of greater diameter. The alternative old tool pot 24a is akin in the other details of construction with the old tool pot 24 of FIG. 4.

As shown also in FIG. 9, the alternative new tool pot 26a includes a pot body 80a in the form of a hollow, upstanding cylinder, having a neck 184 of reduced diameter extending axially upwardly therefrom. The neck 184 has an axial bore 186 communicating with the hollow 96 of the pot body 80a via a tapered annular ledge 188 formed intermediate pot body 80a and neck 184. The neck 184 is further slitted longitudinally as at 92.

The new drill Dn' of the FIG. 11 construction may be inserted, with its body 62 foremost, into the axial bore 186 of the neck 184 until the tapered shoulder 66 of the drill comes to rest on the annular ledge 188, with the drill body 62 extending into the pot body hollow 96. The slitted neck 184 will undergo elastic deformation in its radially outward direction upon insertion of the shank 64a of the new drill Dn', thereby resiliently holding the drill in position in the new tool pot 26a against the possibility of accidental displacement or detachment. The alternative new tool pot 26a can be analogous in the other details of construction with the new tool pot 26 of FIG. 4.

As shown in FIG. 10, each new tool cartridge 30a for use with the modified drills D' has a tool guideway 102a defined longitudinally therein. The guideway 102a has a cross sectional shape similar to the longitudinal shape of each modified drill D' as shown in FIG. 11. Viewed cross sectionally as in FIG. 10, the guideway 102a has a relatively wide upper portion 190, a tapering midportion 192, and a lower portion 194 of reduced width. Each modified drill D' is to be slidably received in this guideway 102a with its shank 64a received in the upper portion 190, its shoulder 66 in the midportion 192, and its body 62 in the lower portion 194. The other details of construction of the modified new tool cartridge 30a can be similar to those of the cartridge 30, set forth previously with reference to FIGS. 5 through 7.

The straight shank drills D' of FIG. 11 offer the advantages of less manufacturing cost, smaller bulk when heaped together, and greater ease of handling.

Alternative Old Tool Recovery Mechanisms

Figure 12:
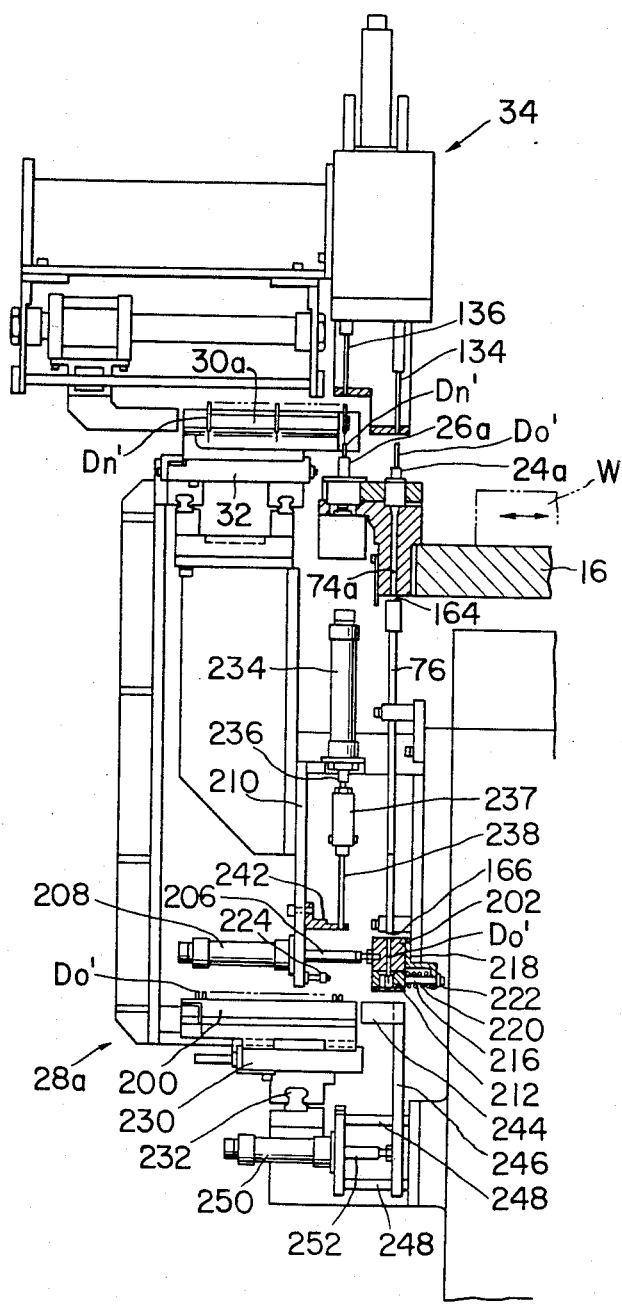
FIG. 12 is a view similar to FIG. 3 but showing in particular an alternative form of the old tool recovery mechanism.
Figure 13:
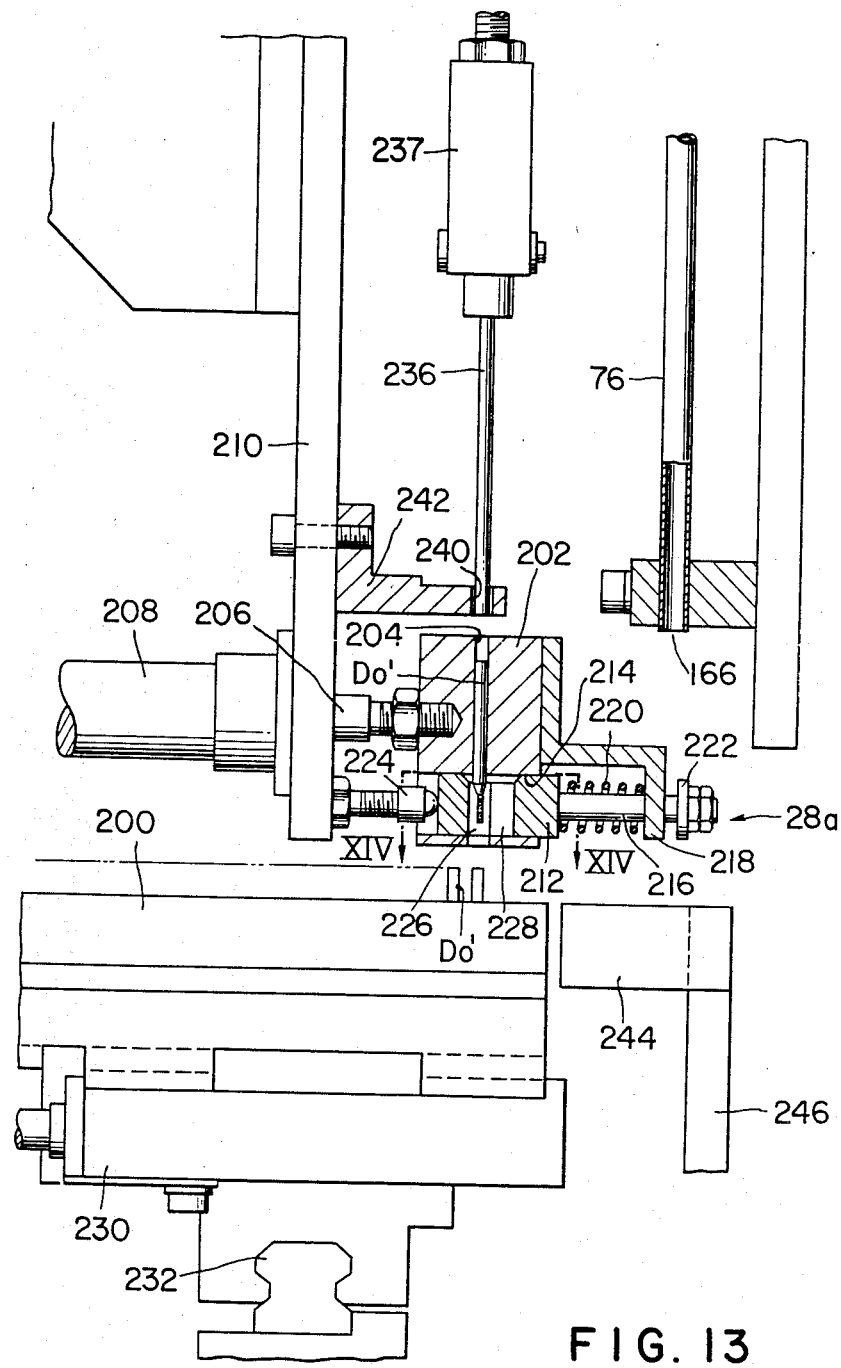
FIG. 13 is a view similar to FIG. 12 but showing only the alternative old tool recovery mechanism both fragmentarily and on an enlarged scale.

We have illustrated in FIGS. 12 through 14 a modified old tool recovery mechanism 28a, for use in the drilling machine 10 of FIGS. 1 and 2 in substitution for each of the four similar mechanisms 28, FIG. 3, which have been employed in the first described embodiment. In this alternative embodiment, however, the drills in use are of the straight shank type illustrated in FIG. 11. The modified old tool recovery mechanism 28a differs from its FIG. 3 counterpart in that the recovered old drills are lined up in successive old tool cartridges, one seen at 200 in FIGS. 12 and 13, instead of being piled up at random in the recovery box 168.

As indicated in FIG. 12, the table 16 for use with the modified recovery mechanism 28a has the old tool pots 24a and new tool pots 26a of the FIG. 9 construction formed thereon along its rear edge. As in the first embodiment each associated pair of old tool pot 24a and new tool pot 26a come into vertical alignment with the old tool pusher rod 134 and new tool pusher rod 136, respectively, of one of the tool pusher mechanisms 34 when the table 16 is moved to the tool change position as in FIG. 12.

A multiplicity of new tool cartridges 30a, each constructed as in FIG. 10 and slidably holding a row of new drills Dn', are mounted on the cartridge carriage 32. The new tool pusher rod 136 of each tool pusher mechanism 34 is in vertical alignment with the tool outlet of one of the new tool cartridges 30a. We assume that the foremost one of the new drills Dn' in each cartridge 30a is held at its tool outlet by the pair of spring energized gripping jaws 112 shown in FIG. 6.

Each modified old tool recovery mechanism 28a includes the chute 76 which is disposed uprightly in this alternative embodiment. The entrance end 164 of the chute 76 is opposed to a discharge passageway 74a extending downwardly from one of the old tool pots 24a.

Disposed under the exit end 166 of the chute 76 is a recovery pot 202 having a tool passageway 204 defined vertically therethrough. The recovery pot 202 is rigidly mounted to the piston rod 206 of a fluid actuated cylinder 208, preferably pneumatic, which is secured to a fixed support member 210. This cylinder 208, which may be termed the recovery pot cylinder, reciprocably moves the recovery pot 202 between a tool loading position of FIG. 12 and an unloading position of FIG. 13. We assume that the recovery pot 202 is provided with a tool sensor, not shown, such as that seen at 176 in FIG. 3, for sensing the loading of each old drill Do'.

As better seen in FIG. 13, a gate 212 is slidably engaged in a guideway 214 defined horizontally through the recovery pot 202 and across the tool passageway 204. The gate 212 is secured to a rod 216 horizontally and slidably extending through a recumbent L shaped arm 218 rigidly mounted to the recovery pot 202. Sleeved upon the rod 216, a helical compression spring 220 urges the gate 212 leftwardly, as seen in FIGS. 12 and 13. Normally, or when the recovery pot 202 is in the tool loading position of FIG. 12, the compression spring 220 holds the gate in a closed position with respect to the recovery pot as a collar 222 on the rod 216 butts on the arm 218.

Upon movement of the recovery pot 202 to the unloading position of FIG. 13, the gate 212 travels therewith into contact with an abutment 224 on the fixed support member 210, thereby to be displaced to an open position with respect to the recovery pot against the force of the compression spring 220. We have therefore shown the gate 212 in the closed position in FIG. 12, and in the open position in FIG. 13, both with respect to the recovery pot 202.

As will be seen from both FIGS. 13 and 14, the gate 212 has a tool passageway 226 of circular cross section extending vertically therethrough and, contiguously, a slotlike aperture 228 having a width less than the diameter of the straight drill shank 64a, FIG. 11, and more than the external diameter of the drill body 62.

When in the loading position of FIG. 12, the recovery pot has its tool passageway 204 in alignment with the chute 76, to be loaded with the successively discharged old drills Do' one at a time. We have stated that the gate 212 is in the closed position when the recovery pot 202 is in the loading position. The gate 212 when in this closed position has its slotlike aperture 228 in alignment with the tool passageway 204 in the recovery pot 202. Consequently, on being loaded into the recovery pot 202 being held in its loading position, the old drill Do' will be arrested by the gate 212, with its body 62 loosely received in the slotlike aperture 228 in the gate and with it shank 64a mostly received in the tool passageway 204 in the recovery pot.

When in the unloading position of FIG. 13, on the other hand, the recovery pot 202 has its tool passageway 204 in alignment with the tool passageway 226 in the gate 212, the latter being now in the open position with respect to the recovery pot. Thus the old drill Do' that has been loaded in the recovery pot 202 and arrested by the gate 212 can be unloaded therefrom through the tool passageway 226 in the gate.

The recovery pot 202 when in the unloading position has its tool passageway 204 in alignment not only with the tool passageway 226 in the gate 212 being held in its open position with respect to the recovery pot, but also with the tool inlet of one of the old tool cartridges 200 mounted side by side on a carriage 230 movable along a guide rail 232 extending in the second horizontal direction Y, FIGS. 1 and 2. This old tool cartridge carriage 230 is similar in construction to the new tool cartridge carriage 32; therefore, the old tool cartridges 200 can be slid into and out of transverse guideways, not shown, in the carriage 230.

Although we have so named the old tool cartridges 200 from the functional point of view, these are, in fact, of the same construction as the new tool cartridges 30a. Thus each old tool cartridge 200 has a tool guideway seen at 102a in FIG. 10 and a pair of gripping jaws seen at 112 in FIG. 6. The aforesaid tool inlet of each old tool cartridge 200 is akin to the tool outlet 110, FIG. 5, of each new tool cartridge 30a. A recovered old drill Do' is releasably held at this tool inlet by the pair of gripping jaws 112.

Fixedly mounted in an upstanding attitude at 234 is a fluid actuated cylinder, preferably pneumatic, having its piston rod 236 connected via a coupling 237 to a push rod 238 in collinear relationship. The push rod 238 slidably extends through a hole 240 in a guide 242 fastened to the fixed support member 210.

When the recovery pot 202 is in the unloading position as in FIG. 13, the push rod 238 is in vertical alignment with the tool passageway 204 in the recovery pot and, in consequence, with the tool passageway 226 in the gate 212 being held in the open position with respect to the recovery pot. Guided by the guide 242, the push rod 238 is movable into and out of the tool passageway 204 in the recovery pot 202 when the latter is in the unloading position. The extension of the cylinder 234 results, therefore, in the unloading of the old drill Do' from the recovery pot 202 into one of the old tool cartridges 200 on the carriage 230 through the open gate 212. We will refer to the cylinder 234 as the unloading cylinder.

Upon loading of each old drill Do' into one of the old tool cartridges 200, the existing row of old tools therein must be pushed away from its tool inlet to provide room for the reception of the next tool. We have employed to this end an old tool feed finger 244 rigidly mounted to an upstanding carrier arm 246 and disposed opposite the front end, shown directed to the right in FIGS. 12 and 13, of the required old tool cartridge 200 for movement into and out of the tool guideway 102a, FIG. 10, therein. The carrier arm 246 is slidably mounted on a pair of guide rods 248 extending in the longitudinal direction of each old tool cartridge 200 on the carriage 230. Extending in the same direction as the guide rods 248, a fluid actuated feed cylinder 250, preferably pneumatic, has its piston rod 252 coupled to the carrier arm 246 for reciprocably moving the same along the guide rods.

Operation of Alternative Recovery Mechanisms

As in the first described embodiment the table 16 is moved to the rearmost tool change position, as shown in FIG. 12, after the old drills Do' have been released in the old tool pots 24a from the toolheads 20. Each tool pusher mechanism 34 also operates as in the foregoing embodiments to thrust down both pusher rods 134 and 136. The new tool pusher rod 136 will push the foremost one of the new drills Dn' in one of the new tool cartridges 30a on the carriage 32 down through its tool outlet into the associated new tool pot 26a on the table 16. The old tool pusher rod 134, on the other hand, will push the old drill Do' in one of the old tool pots 24a on the table 16 down into the discharge passageway 74a and thence into the chute 76 of the associated old tool recovery mechanism 28a.

We understand that the recovery pot 202 of the illustrated representative old tool recovery mechanism 20a is now in the loading position of FIG. 12, with its tool passageway 204 in alignment with the chute 76. Therefore, traveling down the chute 76 by gravity, the old drill Do' will fall into the tool passageway 204 in the recovery pot 202.

The gate 212 is now held in the closed position with respect to the recovery pot 202 under the force of the compression spring 220, with the collar 222 on the rod 216 in abutment against the arm 218. Thus, on falling through the tool passageway 204 in the recovery pot 202, the old drill Do' will have only its body 62, FIG. 11, received in the slotlike aperture 228 in the gate 212 and so will be arrested in the recovery pot 202. We have so designed the gate 212 that the old drill DO' will not have its body 62 impaired in an way on being arrested by the gate, since the latter engages only the tapered shoulder 66 of the drill.

The loading of the old drill Do' in the recovery pot 202 will be sensed by the unshown tool sensor, whereupon the recovery pot cylinder 202 will be contracted to move the recovery pot 202 from the loading position of FIG. 12 to the unloading position of FIG. 13. The gate 212 will hit the abutment 224 during the above movement of the recovery pot 202. When the recovery pot 202 reaches the unloading position, the abutment 224 will cause the gate 212 to be displaced with respect to the recovery pot from the closed to the open position against the bias of the compression spring 220. With such displacement of the gate 212 the body of the old drill Do' will relatively move from slotlike aperture 228 to tool passageway 226 in the gate.

Thus, when the recovery port 202 reaches the unloading position, its tool passageway 204 will be aligned with the tool passageway 226 in the gate 212 and thence with the tool inlet of one of the old tool cartridges 200 on the carriage 230 on one hand and, on the other hand, with the push rod 238 coupled to the unloading cylinder 234.

Now the unloading cylinder 234 may be extended to thrust down the push rod 236 into the tool passgeway 204 in the recovery pot 202. Pushed by the push rod 236, the old drill Do' will fall through the tool passageway 226 in the gate 212 into the tool inlet of the associated old tool cartridge 200, where the drill will be releasably caught by the pair of gripping jaws seen at 112 in FIG. 6.

Then the feed cylinder 250 may be contracted to cause the feed finger 244 to enter the tool guideway in the old tool cartridge 200 from its front end, thereby pushing the existing row of old drills Do', including the only newly loaded therein, away from the tool inlet.

The foregoing cycle of operation may be repeated until the old tool cartridge 200 in question becomes filled with a predetermined number of old drills Do'. Then the cartridge carriage 230 may be moved to bring the next old tool cartridge to the position under the push rod 236.

The alternative old tool recovery mechanism 28a of the foregoing construction offers some advantages over the recovery mechanism 28 of FIG. 3. If the recovered old drills Do have been used for jobs that require utmost precision, and therefore are not worn out, then the old drill cartridges filled with such old drills find direct use as new tool cartridges for less exacting jobs. Moreover, even if the recovered drills must be reground before reuse, they will be much easier of handling, being in cartridge form rather than in bulk form as in the FIG. 3 embodiment.

Notwithstanding the foregoing detailed disclosure, we recognize that our invention could be embodied in forms other than those disclosed herein, without departing from the broad teaching hereof.

We claim:

1. A machine tool capable of changing old cutting tools, worn from use, with new ones, comprising:
 (a) frame means;
 (b) a table mounted to the frame means for reciprocating movement in a predetermined horizontal direction, toward and away from a preassigned tool change position;
 (c) at least one toolhead disposed over the table and releasably holding a cutting tool;
 (d) an old tool pot on the table for temporarily holding in an upstanding attitude an old tool released from the toolhead, the old tool pot including a discharge passageway, defined by a pot body for the discharge of the old tool;
 (e) a new tool pot on the table for temporarily holding in an upstanding attitude a new tool to be held by the toolhead in substitution for the old tool released therefrom in the old tool pot;
 (f) an elongate new tool cartridge for slidably holding a row of upstanding new tools and having a tool outlet adjacent one end thereof, the new tool cartridge being mounted to the frame means and so disposed thereon that the tool outlet thereof overlies and is aligned with the new tool pot on the table when the table is in the tool change position;
 (g) tool pusher means having actuator means for concurrently pushing, when the table is in the tool change position, the old tool in the old tool pot down into the discharge passageway and one of the new tools in the new tool cartridge down through the tool outlet thereof into the new tool pot; and (h) old tool recovery means for recovering the successive old tools discharged through the old tool pot.

2. The machine tool of claim 1 wherein each cutting tool has a shank having a flange formed thereon, and wherein the old tool pot includes a pot body in the form of a hollow, upstanding cylinder having an inside rim at a top end thereof for engaging the flange of the old tool, the pot body being capable of elastic deformation to allow the old tool to be pushed down into the discharge passageway by riding over the inside rim.

3. The machine tool of claim 2 wherein the new tool pot also includes a pot body in the form of a hollow, upstanding cylinder having an annular ledge formed internally for engaging the flange of the new tool.

4. The machine tool of claim 3 wherein the pot bodies of the old and new tool pots are both mounted to the table for vertical displacement, and wherein the machine tool futher comprises resilient means for resiliently supporting the pot bodies with respect to the table.

5. The machine tool of claim 1 wherein each cutting tool, both old and new, includes a straight shank having a tapered shoulder and a body extending therefrom, and wherein the old tool pot includes a pot body in the form of a hollow, upstanding cylinder having a constricted neck adapted for resiliently holding the straight shank of the old tool.

6. The machine tool of claim 5 wherein the new tool pot includes a pot body in the form of a hollow, upstanding cylinder having a neck adapted for resiliently holding the straight shank of the new tool, and a tapered annular ledge formed between the pot body and the neck to allow the tapered shoulder of the new tool to rest thereon with the body of the new tool protruding into the hollow in the pot body.

7. The machine tool of claim 6 wherein the pot bodies of the old and new tool pots are both mounted to the table for vertical displacement, and wherein the machine tool further comprises resilient means for resiliently supporting the pot bodies with respect to the table.

8. The machine tool of claim 1 wherein the new tool cartridge is in the form of an elongate box having a tool guideway extending longitudinally therethrough for slidably receiving the row of upstanding new tools, the tool guideway being in direct communication with the tool outlet, and wherein the new tool cartridge is provided with means for releasably holding one of the new tools at the tool outlet.

9. The machine tool of claim 1 wherein the tool pusher means comprises:
(a) an old tool pusher rod disposed uprightly for pushing the old tool in the old tool pot down into the discharge passageway; and
(c) a new tool pusher rod disposed uprightly for pushing one of the new tools in the new tool cartridge down through the tool outlet thereof into the new tool pot; and
(d) the old and new tool pusher rods being both coupled to the actuator thereby to be jointly moved up and down with respect to the table.

10. The machine tool of claim 1 wherein the old tool recovery means comprises:
(a) a chute having an entrance end in communication with the discharge passageway in the old tool pot when the table is in the tool change position, the discharged old tool traveling down through the chute; and
(b) a recovery box disposed opposite an exit end of the chute for receiving the old tool therefrom.

11. The machine tool of claim 10 further comprising a retractable gate for temporarily arresting each old tool at the exit of the chute in order to cause the old tool to land softly into the recovery box.

12. The machine tool of claim 1 wherein the old tool recovery means comprises:
(a) a chute having an entrance end disposed to receive the old tool discharged through the old tool pot when the table is in the tool change position;
(b) a recovery pot having a tool passageway defined therethrough and reciprocably movable between a loading position, where the recovery pot has its tool passageway held opposite an exit end of the chute for receiving the old tool therefrom, and an unloading position away from the loading position;
(c) gate means for closing the tool passageway in the recovery pot when the latter is in the loading position, and for opening the tool passageway when the recovery pot is in the unloading position; and
(d) an elongate old tool cartridge for slidably holding the successive discharged old tools in a row and having a tool outlet adjacent one end thereof, the old tool cartridge being so disposed as to receive through the tool inlet thereof the old tool from the recovery pot when the latter is in the unloading position.

13. The machine tool of claim 12 wherein the gate means of the old tool recovery means comprises:
(a) a gate having defined therethrough a second tool passageway and slidably engaged in a gate guideway defined in the recovery pot across the first recited tool passageway in the recovery pot, the gate being movable with respect to the recovery pot between a closed position, where the second tool passageway is out of alignment with the first tool passageway, and an open position where the second tool passageway is aligned with the first tool passageway, the gate being further movable with the recovery pot between the loading and unloading positions thereof;
(b) resilient means for holding the gate in the closed position when the recovery pot is in the loading position; and
(c) an abutment disposed for engagement with the gate upon movement of the recovery pot from the loading to the unloading position, the abutment being effective to cause the gate to be moved from the closed to the open position against the force of the resilient means when the recovery pot reaches the unloading position.

14. The machine tool of claim 13 wherein the cutting tool, both old and new, is a drill having a straight shank connected to a drill body via a shoulder, and wherein the gate of the gate means has defined therein an aperture contiguous to the second tool passageway in the gate, the aperture being aligned with the first tool passageway in the recovery pot when the latter is in the loading position, the aperture being adapted to receive only the drill body of the old tool loaded in the recovery pot when the latter is in the loading position, so that the old tool is arrested by the gate by having its shoulder engaged thereby.

15. The machine tool of claim 13 wherein the old tool recovery means further comprises a push rod for pushing, when the recovery pot is in the unloading position, the old tool down through the first tool passageway in the recovery pot and the second tool passageway in the gate into the old tool cartridge.

16. The machine tool of claim 12 wherein the old tool cartridge of the old tool recovery means is of the same construction as the new tool cartridge.

17. A drilling machine for creating holes of like or unlike diameters in work such as printed circuit board blanks, with a capability of changing old drills, worn from use, with new ones, comprising:
 (a) a frame means;
 (b) a table mounted to the frame means for reciprocating movement in a first horizontal direction toward and away from a preassigned tool change position;
 (c) a plurality of toolheads disposed side-by-side over the table and aligned in a second horizontal direction at right angles with the first horizontal direction, each toolhead releasably holding a drill for drilling the work on the table;
 (d) a plurality of old tool pots aligned in the second horizontal direction on the table each for temporarily holding in an upstanding attitude an old drill released from one of the toolheads, each old tool pot including a discharge passageway defined by a pot body for the discharge of the old tool;
 (e) a plurality of new tool pots also aligned in the second horizontal direction on the table for each temporarily holding in an upstanding attitude a new drill to be held by one of the toolheads in substitution for the old drill released therefrom in one of the old tool pots;
 (f) a plurality of elongate new tool cartridges each for slidably holding a row of upstanding new drills and having a tool outlet adjacent one end thereof, the new tool cartridges being so disposed that the tool outlets thereof are in vertical alignment with the respective new tool pots on the table when the table is in the tool change position;
 (g) tool pusher means for concurrently pushing, when the table is in the tool change position, the old drills in the old tool pots down into the discharge passageways and one of the new drills in each new tool cartridge down through the tool outlet thereof into the associated one of the new tool pots; and
 (h) old tool recovery means for recovering the successive old tools discharged through the old tool pot.

18. The drilling machine of claim 17 wherein the tool pusher means comprises a plurality of tool pusher mechanisms each for one of the old tool pots and one of the new tool pots, each tool pusher mechanism comprising:
 (a) an old tool pusher rod disposed uprightly for pushing the old tool in one of the old tool pots down into the associated discharge passageway; and
 (c) a new tool pusher rod disposed uprightly for pushing one of the new tools in one of the new tool cartridges down through the tool outlet thereof into the associated new tool pot; and
 (d) a pusher actuator coupled to both the old and new tool pusher rods for jointly moved the same up and down with respect to the table.

19. The drilling machine of claim 17 further comprising a cartridge carriage elongated in the second horizontal direction and having removably mounted thereon the new tool cartridges together with additional new tool cartridges each loaded with a row of new drills, the cartridge carriage being movable in the second horizontal direction to bring the successive new tool cartridges into alignment with the new tool pots on the table.

* * * * *